United States Patent [19]
Miller

[11] Patent Number: 5,439,528
[45] Date of Patent: Aug. 8, 1995

[54] LAMINATED THERMO ELEMENT

[76] Inventor: Joel Miller, 14340 Trinidad Rd., San Leandro, Calif. 94577

[21] Appl. No.: 332,506

[22] Filed: Oct. 31, 1994

Related U.S. Application Data

[63] Continuation-in-part of Ser. No. 164,698, Dec. 8, 1993, abandoned, which is a continuation-in-part of Ser. No. 989,631, Dec. 11, 1992, abandoned.

[51] Int. Cl.[6] ............................................. H01L 35/16
[52] U.S. Cl. ................... 136/200; 136/236.1; 136/238; 136/239; 257/467; 257/470; 257/930
[58] Field of Search ............... 136/200, 201, 211, 212, 136/224, 225, 227, 236.1, 237, 238, 239, 242; 257/15, 16, 17, 22, 23, 28, 467, 468, 470, 930

[56] References Cited

U.S. PATENT DOCUMENTS

| | | | |
|---|---|---|---|
| 434,429 | 8/1890 | Cox | 136/211 |
| 2,229,481 | 1/1941 | Telkes | 136/5 |
| 3,208,835 | 9/1965 | Duncan et al. | 29/195 |
| 3,296,033 | 1/1967 | Scuro et al. | 136/205 |
| 3,330,703 | 7/1967 | Podolsky | 136/239 |
| 3,432,365 | 3/1969 | Katz | 136/237 |
| 3,674,568 | 7/1972 | Caprarola | 136/205 |
| 3,873,370 | 3/1975 | Hampl, Jr. et al. | 136/205 |
| 3,901,734 | 8/1975 | Sibley et al. | 136/241 |
| 5,006,178 | 4/1991 | Bijvoets | 136/211 |
| 5,156,004 | 10/1992 | Wu et al. | 62/3.1 |

FOREIGN PATENT DOCUMENTS

| | | | |
|---|---|---|---|
| 339715 | 11/1989 | European Pat. Off. | 136/200 |
| 63-253677 | 10/1988 | Japan | 136/224 |
| 1-208876 | 8/1989 | Japan | 136/200 |
| 2-106079 | 4/1990 | Japan | 136/200 |
| 1216001 | 12/1970 | United Kingdom | 136/236.1 |

OTHER PUBLICATIONS

Heat and Thermodynamics by Zemansky McGraw-Hill Book Co., N.Y. 1943, pp. 266-269.

Primary Examiner—Donald P. Walsh
Assistant Examiner—Chrisman D. Carroll
Attorney, Agent, or Firm—Robert Samuel Smith

[57] ABSTRACT

A thermoelement (leg) of a thermocouple for use in peltier heating or generation of power by the Seebeck effect including a plurality of interleaved films wherein compositions of neighboring films are selected to create Kapitza boundaries between the films such as to reduce thermal conductivity but provide adequate electrical conductivity. The plurality of interleaved films includes a semiductor with suitable doping to establish required extrinsic conductivity and metals having dissimilar lattices such as aluminum and tungsten abutting one another. The practical number of films in the composite to establish the effect is ten. A preferred thickness of the films is less than twenty thousand Angstroms.

12 Claims, 2 Drawing Sheets

LAMINATED THERMO ELEMENT

CROSS REFERENCE TO EARLIER APPLICATIONS

This application is a continuation-in-part of application Ser. No. 08/164,698 filed Dec. 8, 1993, now abandoned, which was a continuation-in-part of application Ser. No. 07/989,631 filed Dec. 11, 1992, now abandoned.

FIELD OF THE INVENTION

This invention relates to thermoelements for generating electrical power by applying the Seebeck effect and particularly to a thermoelement having a laminated structure to improve efficiency.

PRIOR ART AND INFORMATION DISCLOSURE

The Seebeck effect is the effect whereby an electrical potential is generated by joining two dissimilar conductors at two locations and maintaining each location at a temperature different from the temperature at the other location. The Peltier effect is the effect in which passing an electric current around a loop of two dissimilar conductors joined at two locations causes heat to be transferred from one junction to the other. These two thermoelectric effects may be demonstrated by devices such as are shown in FIGS. 4A and 4B which shows a first conductor 110 joined to a second dissimilar conductor 112 at a first location 114 and a second location 116. To demonstrate the Seebeck effect, the first location is maintained at temperature T" and the second location is maintained at temperature T'. The magnitude and polarity of the electrical potential, V, measured between terminals 118 and 120 is proportional to T—T". As shown in FIG. 4B, the Peltier effect is demonstrated by passing a current I through the terminals 118 and 120 and around the loop formed by the joined conductors thereby causing a temperature difference between the two junctions.

The figure of merit of a device utilizing the Seebeck effect is defined as being the ratio expressed as a percent of the electrical power generated at terminals 18 and 20 to the thermal power injected into the junction maintained at the higher temperature.

These thermoelectric effects are explained as being due to a difference of work function between the two conductors which is dependent on temperature. (Work function of a conductor is defined as the amount of energy required to move the most energetic electrons in the conductor to infinity.) Work function depends on temperature of the lattice. Therefore, a difference in electrical potential can be produced between two locations in a single isolated crystal by maintaining a temperature difference between the locations. This is known as the Thompson effect.

When the surfaces of two dissimilar crystal lattices are brought into contact, the most energetic electrons in the conduction band of the crystal lattice having the smaller work function populate empty lower energy levels of the other lattice in accordance with Fermi statistical theory. The flow of electrons from the first lattice having the lower work function to the second lattice will continue until the electric field (potential barrier) generated by the zone of empty energy levels (manifested as positive charges) in the first lattice becomes great enough to prevent further flow.

When an electric potential is applied (such as to the terminals shown in FIGS. 4A and B) electric current flows across the potential barrier that has been created at the junctions 114 and 116 by the difference in work functions.

As the electron moves from the higher energy state of the first lattice to the lower energy state of the second lattice, two modes of energy transfer take place from the electron which has gained energy by falling through the potential barrier. One mode is the gain in thermal energy in terms of lattice vibration due to collisions of the electron with the lattice. The second mode is the remaining kinetic energy of the electron arriving in the second lattice.

Intensive research over the past thirty years have revealed that factors in addition to differences in work function are also important in determining the efficiency of a pair of joined conductors (the thermocouple). For example, thermal conductivity of each conductor has been found to be an important factor.

Thermal resistance (or conductance) is related to crystal structure of a regular lattice which transfers heat by way of the vibrational modes of the lattice. Interruptions in the regularity of the lattice interfere with the regular modes of vibration such as to impede the flow of heat. Such interruptions occur at the surface of one compound having one lattice structure abutting the surface of a second compound having another lattice structure. The barrier to flow of heat thus formed is called "a Kapitza resistance boundary".

Kapitza resistance boundaries exist between two compounds having different densities and crystal structures. They are also formed by the cleavage planes in homgeneous compounds.

According to the present state of the art, the most efficient thermoelements are homogeneous semiconductors such as lead telluride, bismuth telluride, antimony telluride, germanium telluride, silver indium telluride, silver gallium telluride, copper gallium telluride, sodium manganese telluride. Compounds of selenium, for example silver antimony selenide and of sulfur, for example the rare earth sulfides, exhibit strong thermoelectric properties. Compounds containing at least one member of the group selenium, sulfur and tellurium are known as chalcogenides. While the pure compounds may be utilized, more efficient thermoelectric compositions usually consist of alloys of more than one compound. Small amounts of various additives or doping agents (such as lead, iodide or sodium, depending on the type of required semiconductor) may be incorporated into the thermoelectric composition to establish the type of conductivity (p or n) of the material.

A thermoelectric device such as used to generate power or to heat or cool, comprises bodies of two thermoelements (conductors) bonded to a block of metal (e.g., aluminum, copper, or iron) to form a thermocouple junction. The two thermoelements are thermoelectrically complementary to one another, one being a p-type and the other being n type. With N type conductors, current flows from the thermocouple into the N type thermoelement when joined to a metal such as copper or lead. With P type semiconductors, current flows to the thermocouple when joined to a metal such as copper or lead.

According to present state of the an of thermoelectric devices for converting thermal power to electrical power, the highest figure of merit that has been achieved is in the neighborhood of 11 percent (Carnot efficiency) conversion of heat energy to electrical energy. In fact, theory predicts that the greatest efficiency that can be obtained for devices of the prior art is 18%. These low efficiencies have resulted in limiting the application of thermoelectric power generation to purposes where long life, low maintenance, quiet operation, small size and light weight have outweighed the normally regarded commercial considerations of cost and need for energy efficiency. Similarly, application of thermoelectric prior art to cooling purposes have been subject to the same practical and theoretical limits. Conventional refrigeration systems are much more efficient and cost effective. It has long been recognized that a good thermoelectric material should have a high electrical conductivity in order to achieve the most Carnot efficient conversion of energy in a thermoelectric generator of electrical power or effective displacement of thermal energy in a thermoelectric cooling and heating system.

A number of patents have appeared disclosing arrangements in which semiconductors having complementary charge carriers are joined to one another and the circuit is completed by metallic conductors leading away from the junction.

For example, U.S. Pat. No. 3,296,033 to Scuro et al discloses thermoelectric elements in which a section of the thermoelements is liquid thereby preventing problems of breakage that occurs because of differences in thermal expansion.

U.S. Pat. No. 3,674,568 to Caprarola discloses a thermocouple including two complementary thermoelements in which one thermoelement (N-type silicon) is selected for its inertness to the environment and ruggedness as well as for its high figure of merit and is constructed to enclose the second thermoelement (lead telluride) which is selected for its large figure of merit but which does not have the large resistance to ambient conditions (corrosion resistance) as the silicon. The construction in which the n-type silicon effectively encloses the lead telluride provides protection to the lead telluride in accordance with the invention.

U.S. Pat. No. 3,873,370 to Hampl discloses a thermoelement leg composed of a metalloid composition such as a metal chalcogen. The leg includes a thin transverse section intermediate end sections of tile leg which prevents atomic migration from one end of the leg to the other.

U.S. Pat. No. 5,006,178 to Bijvoets discloses thermoelectric elements having metalloid junctions at the hot and cold locations connected by metal conductors. This construction has the advantage of improved electrical conductivity between the hot and cold locations but the disadvantage of enhanced thermal conductivity between the junctions.

U.S. Pat. No. 5,156,004 to Wu et al discloses a thermoelement including p and n type members brazed together to form an electrically conducting path and in thermal contact with a heat transmitting plate by virtue of a thermoconductive grease interposed between the p-n junction and the heat transmitting plate.

None of these disclosures address the problem associated with simultaneous large electrical and thermal conductance which limits the efficiency of the thermoelement. All known homogeneous and monolithic conductors are also good to excellent thermal conductors. There has not been discovered one exception to this situation in spite of vast resources poured into researching the issue.

THE INVENTION

OBJECTS

It is an object of this invention to provide an improved thermoelement. It is contemplated to achieve this object by providing a thermoelement that has a greater thermal resistance for comparable electrical resistance compared to thermoelements of the prior art.

It is another object that the thermoelements of this invention be fabricated using materials that are readily available.

It is another object to provide a new form of thermoelement using these relatively easily available materials.

It is another object to provide an improved electrically managed thermal gate device.

SUMMARY

This invention is directed toward a thermoelectric junction in which each leg of the junction is a thermoelectric element comprising layers of a semiconductor film interleaved with layers of film having one or more other compositions. The semiconductor layers of one leg are p-type while the semiconductor films of the other leg are n-type. The compositions of the interleaving films are selected to maximize the kapitza barriers formed between the layers thereby decreasing the thermal conductivity of the leg while maintaining adequate electrical conductivity. The reduction of thermal conductance is directly proportional to the number of interfaces between layers, therefore the films are made as thin as practical without sacrificing continuity of the film. Therefore, film forming techniques such as sputtering are the preferred method of manufacturing the film.

In one embodiment of the invention, one leg comprises layers of p-type lead telluride interleaved with layers of p-type lead selenide and the other leg comprises n-type doping of the same compounds. In another embodiment, one leg comprises layers of n doped lead telluride interleaved with layers of tungsten and the other leg comprises layers of p doped lead telluride interleaved with layers of tungsten. In yet another embodiment, one leg comprises layers of p doped lead telluride, layers of tungsten and layers of aluminum interleaved with one another. Another technique of this invention is to interpose in either one or both legs layers of aluminum-interleaved in contact with a refractory metal, particularly either tungsten, tantalum or molybdenum. The interleaved layers are stacked such as to achieve a length of the leg which is useful for application in a thermoelectric device. Accordingly, processes for producing the interleaved structure of this invention permit formation of anywhere from a hundred to thousands of layers depending on the application. A major advantage of interleaving a telluride compound with a selenide compound is that tellurium does not react actively with selenium.

DESCRIPTION OF A BEST MODE

Figure 1:
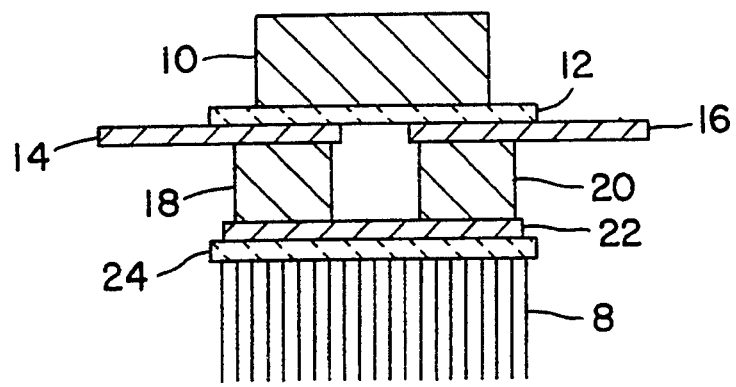
FIG. 1 shows a thermocouple including two thermoelements.

In the following discussion of the drawings, the following table lists the items and their reference numbers in the drawings.

| | |
|---|---|
| 8 | heat source |
| 10 | heat sink |
| 12 | insulating substrate |
| 14 | cathode |
| 16 | anode |
| 18 | p-type thermoelement |
| 20 | n-type thermoelement |
| 22 | bus |
| 24 | insulating substrate |
| 26 | tungsten film |
| 28 | lead telluride film |
| 30 | aluminum film |

Turning now to a discussion of the drawings, FIG. 1 is a sectional view of the invention showing a heat sink 10, abutting one side of an electrically insulating substrate 12 whose other side abuts a cathode 14 and an anode 16. The opposite sides of the cathode and anode each abuts one end of thermoelements 18 and 20 respectively. Opposite ends of thermoelements 18 and 20 are electrically connected by bus 22 whose opposite side is supported on electrically insulating substrate 24. Thermoelement 18 (one leg of the thermocouple) comprises interleaved multi layers of p-doped lead telluride and tungsten. Thermoelement 20 (the second leg of the thermocouple) comprises interleaved layers of n-doped lead telluride and tungsten.

Figure 2:
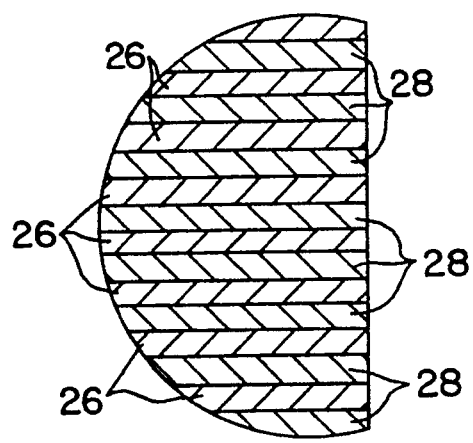
FIG. 2 shows a magnified sectional view of the thermoelement of FIG. 1.

FIG. 2 shows details of the construction of the thermoelement of each leg of FIG. 1 (cutaway and magnified). FIG. 2 shows layers of Tungsten 26 interleaved with layers of lead telluride 28. In one leg, the lead telluride is p doped and in the other leg the leg is n-doped.

Figure 3:
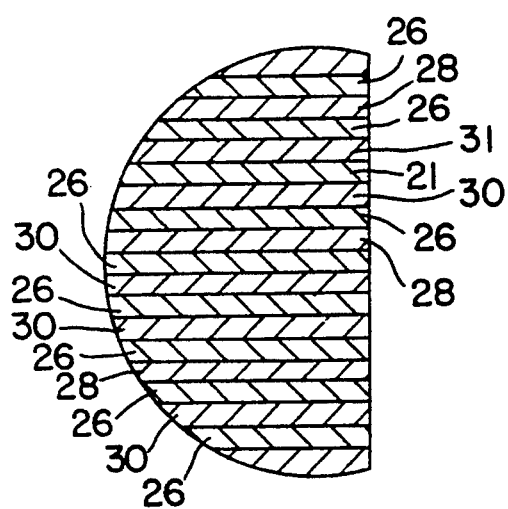
FIG. 3 shows another embodiment of the composition of the films.
Figure 4A:
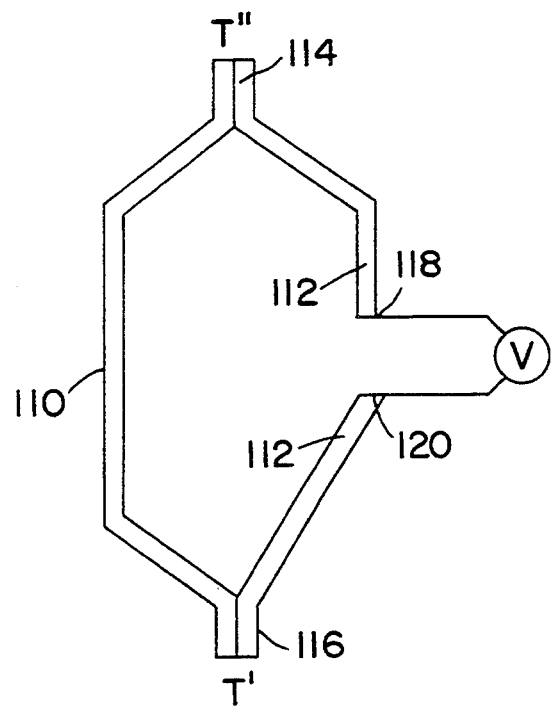
FIG. 4A is an illustration of the Seebeck effect according to the prior art.
Figure 4B:
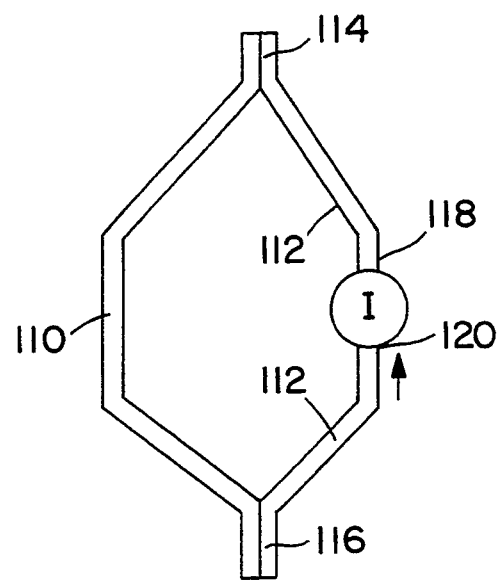
FIG. 4B is an illustration of the Peltier effect according to the prior art.

FIG. 3 is a sectional magnified view of a multilayered thermoelement including a molybdenum or tantalum or tungsten layer 26, which is bonded to the lead telluride film 28. The other side of the tungsten or tantalum or molybdenum layer 30 interfaces an aluminum film 30. Both the molybdenum-aluminum or tantalum aluminum or tungsten-aluminum interface and the tungsten lead telluride molybdenum lead telluride or tantalum lead telluride interface form Kapitza boundaries by virtue of the dissimilar lattices which reduce the flow of heat through the thermoelement but which do not obstruct flow of electrical current thereby satisfying the requirement that the leg of the thermoelement be a good electrical conductor and a poor thermal conductor.

The Kapitza boundary may be viewed as functioning like a mirror which reflects the phonons (vibrations of the lattice manifested as heat) thereby reducing heat flow. This function of the boundary between neighboring laminates (lead telluride, tungsten and aluminum in the case of FIG. 3) is not dependent on the thickness of the laminate films so that, in accordance with the invention, the lead telluride tungsten and aluminum films are preferably less than 20,000 Angstroms. In a preferred embodiment, the tungsten layer is about 1000 A thick, the lead tellurium is less than 500 A, the aluminum film is less than 1000 A. The minimum thickness of the films is determined by the requirement that the film be continuous which on the basis of the ability to produce a continuous film by sputtering is about 10 Angstroms. The minimal thickness of each layer of lead telluride as embodied in this invention reduces thermal conductivity while maintaining adequate electrical conductivity thereby increasing the efficiency of the thermoelectric element.

It will be understood that increased advantage of reducing joule flow of heat through the thermoelement of this invention is gained in proportion to the number of Kapitza boundaries that are formed. From a practical standpoint, this means that at least fifteen parallel kapiza boundaries should be present in each thermoelement.

While the example discussed above is directed toward a composition of the films as being lead telluride and tungsten, other compositions may be combined in accordance with the principles of the invention. The selection of the compositions depends on the circumstances of the application such as temperature range, corrosive environment, etc.

For example, one such selection of compositions includes one thermoelement (leg) of the thermocouple comprising layes of p-type lead telluride interleaved with layers of p-type lead selenide and the other thermoelement comprising layers of n- type lead telluride interleaved with layers of n-type lead selenide.

It will be further understood that the performance of the thermoelements of this invention determined by the formation of Kapitza boundaries between films depends upon the dissimilarities of the lattice structures of the compositions of the films. The lattice structures may be dissimilar in terms of the unit cells (e.g., bodycentered cubic versus hexagonal) lattice spacing, or other well known parameterrs. The term, "composition of the film" will be understood to include elemental metals, alloys, semiconductors, and generally all compositions exhibiting electrical conductance.

Although I do not wish to be bound by the following theory, it is believed that the superior efficiency of the thermoelements of the present invention may be explained by the following line of reasoning.

The object of this invention differs from the object of the inventions disclosed in the BACKGROUND of this specification in that the object of the prior art is to prevent migration of the donor/acceptor impurities from one end of the leg to the other whereas the object of the present invention is not only to prevent migration but also to impede joule heat flow. Reduction of impurity migration is a BULK effect and is directly proprortional to the total thickness of the impeding layer (e.g., tungsten) located in the path of the migrating ions. The obvious least costly way of building such a structure is simply to impose a slab of the interfering material (e.g., tungsten) transversely in the path of the migrating ions. In contrast, the creation of Kapitza barriers transverse to the flow of heat is a SURFACE effect, independent of the total bulk of the heat flow impeding barrier so that the effectiveness in building up maximum resistance to heat flow resides in having many interfaces (aluminum-tungsten, tungsten-semiconductor) transverse to the direction of heat flow. This is presently accomplished in constructing the device of the present invention by evaporation or sputtering techniques. According to the manufacturing process, a terminal layer such as copper is sputtered onto a substrate. Then a layer of semiconductor material is deposited over the terminal layer. Then a barrier layer (e.g., tungsten/aluminum) is deposited over the semiconductor layer. The steps of depositing semiconductor layer then barrier layer are repeated a sufficient number of times (hundreds or more) until a composite thermoelement having an improved resistance to joule heat flow is achieved.

In view of the variations and modifications which are included in the scope of this invention, I wish to define the scope of this invention by the appended claims. In the context of the claims, a word such as first, second, third, etc. preceding "plurality" is to be understood as being an adjective modifying the noun "plurality" to simply designate one quantity (e.g., a second plurality) as being different from another quantity (e.g., a first plurality).

I claim:

1. A thermoelement which comprises:
   a stack of a plurality of films, each film having a composition which is different from a composition of either one of its neighboring films;
   at least one of said films being aluminum;
   said stack of films having a first end surface and a last end surface;
   a first substrate contacting said first end surface and a second substrate contacting said last end surface;
   said first and second substrates being composed of material selected front a group of materials which consists of p type and n type semiconductors.

2. A thermoelement as in claim 1 wherein the composition of each one of said plurality of films is selected from a group of compositions which consists of aluminum and tungsten.

3. A thermoelement as in claim 1 which comprises at least one of said at least one of said aluminum layers being in contact with a tungsten layer.

4. A thermoelement as in claim 1 which comprises at least one of said plurality of films having a composition selected from a group that consists of a p type semiconductor, an n type semiconductor and tungsten.

5. A thermoelement as in claim 1 wherein a thickness of each said film of said plurality of films is less than twenty thousand Angstroms.

6. A thermoelement as in claim 1 wherein at least one of said plurality of films has a composition that is selected from a group of compositions which consists of p-doped lead selenide, n-doped lead selenide, p type telluride and n type lead telluride.

7. A thermoelement as in claim 1 wherein the composition of each one of said plurality of films is selected from a group of compositions which consists of a doped lead chalcogen compound, tungsten and aluminum and said plurality of films includes tungsten films that are about one thousand Angstroms thick, said layers of doped lead chalogen compound films are about five hundred Angstroms thick and said aluminum films are about one thousand Angstroms thick.

8. A thermocouple of the type having a first leg and a second leg, said first leg comprising:
   a first stack of a first plurality of films, each film having a composition which is different from a composition of either one of its neighboring films;
   at least one of said first plurality of films being aluminum;
   said stack of films having a first end surface and a second end surface
   a first substrate contacting said first end surface and a second substrate contacting said second end surface;
   said first and second substrates being composed of a p type semiconductor; and
   said second leg comprising:
   a second stack of a second plurality of films, each film having a composition which is different from a composition of either one of its neighboring films;
   at least one of said first plurality of films being aluminum;
   said second stack of films having a third end surface and a fourth end surface;
   a third substrate contacting said third end surface and a fourth substrate contacting said fourth end surface;
   said third and fourth substrates being composed of an n type semiconductor
   means for forming an electrical contact between said second and third substrates
   a first terminal connected to said first substrate and a second terminal connected to said fourth substrate.

9. A thermoelement which comprises
   a stack of a plurality of tungsten layers interleaved with layers of lead telluride and having a pair of outside layers being lead telluride.

10. A thermoelement as in claim 1 which comprises at least one aluminum film being in contact with a film selected from a group of metals that consists of tungsten, molybdenum and tantalum.

11. A thermoelement which comprises
    a stack of a plurality of metal layers, each metal layer interleaved with a layer of lead telluride, said stack having a pair of outside layers being lead telluride wherein each metal layers is selected from a group of metals that consists of tungsten, molybdenum and tantalum.

12. A thermoelement which comprises:
    a stack of a plurality of layers of tungsten interleaved with layers of lead telluride, said stack having outside layers of tungsten.

* * * * *